(12) United States Patent
Horikawa et al.

(10) Patent No.: US 6,208,063 B1
(45) Date of Patent: Mar. 27, 2001

(54) SURFACE ACOUSTIC WAVE DEVICE HAVING POLYCRYSTALLINE PIEZOELECTRIC CERAMIC LAYERS

(75) Inventors: Katsuhiro Horikawa, Shiga-ken; Akira Ando, Omihachiman, both of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/433,517

(22) Filed: Nov. 3, 1999

(30) Foreign Application Priority Data

Nov. 10, 1998 (JP) .................................................. 10-318902

(51) Int. Cl.$^7$ ....................................................... H03H 9/25
(52) U.S. Cl. ......................................................... 310/313 R
(58) Field of Search .............................. 310/358, 313 A, 310/313 B, 313 R

(56) References Cited

U.S. PATENT DOCUMENTS

| | | | |
|---|---|---|---|
| 3,943,389 | * | 3/1976 | Hickernell et al. .................... 310/9.5 |
| 4,564,782 | * | 1/1986 | Ogawa ................................... 310/359 |
| 4,568,848 | * | 2/1986 | Ogawa ................................ 310/313 B |
| 4,952,832 | * | 8/1990 | Imai et al. ........................ 310/313 A |
| 4,967,113 | * | 10/1990 | Mitsutsuka ........................ 310/313 R |
| 5,446,330 | | 8/1995 | Eda et al. .......................... 310/313 R |
| 5,920,143 | * | 7/1999 | Tarui et al. ....................... 310/313 A |
| 5,977,686 | * | 11/1999 | Kadota et al. ................... 310/313 B |
| 5,998,907 | * | 12/1999 | Taguchi et al. .................. 310/313 R |

FOREIGN PATENT DOCUMENTS

| | | | |
|---|---|---|---|
| 0 833 446 A2 | 4/1998 | (EP) | ................. H03H/9/02 |
| 56031213 | 3/1981 | (JP) | ................. H03H/9/25 |
| 59218028 | 12/1984 | (JP) | ................. H03H/9/25 |

OTHER PUBLICATIONS

Michio Kadota et al., Japanese Journal of Applied Physics, Proc. 12th Symp. on Ultrasonic Electronics 31 Sullp. 31–1, Yokohama, Japan, "Ceramic Resonators Using BGS Waves," Dec. 1991.

Hideaki Adachi et al., Japanese Journal of Applied Physics, 24 suppl. No. 24, Part 1, Tokyo, Japan, "SAW Properties of PLZT Epitaxial Thin Films," Dec. 1984.

* cited by examiner

*Primary Examiner*—Thomas M. Dougherty
(74) *Attorney, Agent, or Firm*—Keating R. Bennett, LLP

(57) ABSTRACT

A surface acoustic wave device includes a piezoelectric substrate, and an interdigital transducer provided on the piezoelectric substrate, wherein the piezoelectric substrate includes at least two piezoelectric ceramic layers made of a polycrystalline material. The at least two piezoelectric ceramic layers are stacked so that electrical characteristics and mechanical characteristics thereof vary in a direction that is substantially perpendicular a surface of the piezoelectric substrate upon which the at least two ceramic piezoelectric layers are stacked.

11 Claims, 6 Drawing Sheets

PROPAGATING DIRECTION

POLARIZING DIRECTION

ENERGY (RELATIVE RATIO)

DEPTH FROM SURFACE (RELATIVE RATIO)

—— A-1, A-2
------ A-3 *

SURFACE ACOUSTIC WAVE DEVICE HAVING POLYCRYSTALLINE PIEZOELECTRIC CERAMIC LAYERS

BACKGROUND OF THE INVENTION

1. Field of the Invention

The present invention relates to a surface acoustic wave device, and more specifically, to a surface acoustic wave device which generates BGS waves therein for use in high-frequency resonators and high-frequency filters.

2. Description of the Related Art

A surface acoustic wave device is generally made of a substrate having piezoelectricity ("a piezoelectric substrate") and a pair of comb-shaped electrodes having a plurality of electrode fingers arranged on the substrate so that the electrode fingers are interdigitated with one another. Such a surface acoustic wave device generates a surface acoustic wave when an electric signal is applied to the interdigital transducer.

As a surface acoustic wave, Rayleigh waves are well known, but BGS waves (Bleustein-Gulyaev-Shimizu waves or piezoelectric surface shear waves) and Love waves have also been used.

In these surface acoustic waves, a resonant frequency and electrical and mechanical characteristics thereof, such as an electrical or mechanical quality factor "Q" and an electromechanical coupling factor "k," are roughly determined by the material quality of the piezoelectric substrate and the configuration of the interdigital transducer. Uses of such surface acoustic waves for high-frequency resonators and high-frequency filters are possible.

A surface acoustic wave literally is an elastic surface acoustic wave that propagates concentrated energy in the vicinity of the surface of a substrate. There are only two components of a displacement of the surface acoustic wave propagating along a surface on an isotropic substrate; one component in the wave progress direction and one component in the direction of the substrate thickness. There is no surface acoustic wave (an SH wave or a horizontally-polarized shear wave), corresponding to a transverse wave, having only one component in a direction that is perpendicular to the wave propagation direction and parallel to the substrate surface in the isotropic substrate.

However, since the piezoelectric substrate is anisotropic, it can propagate the SH wave (including a pseudo SH wave) with concentrated energy in the vicinity of the surface thereof. This surface acoustic wave is called a BGS wave. Since the BGS wave is completely reflected by an edge of the piezoelectric substrate in the wave propagation direction, it is not required that a reflecting device (a reflector) be disposed on the substrate as in a surface acoustic wave device propagating Rayleigh waves. Therefore, the BGS wave has an advantage over the Rayleigh wave with respect to miniaturizing a surface acoustic wave device.

However, the BGS wave using a substrate having a small electromechanical coupling factor "k" cannot achieve sufficient filter characteristics when a narrow band filter is formed because an impedance ratio Za/Zr, which is a ratio between an impedance Za at an anti-resonant frequency and an impedance Zr at a resonant frequency, is comparatively small. On the other hand, the BGS wave using a substrate having a large electromechanical coupling factor "k" has very poor resistance to external conditions, although the impedance ratio Za/Zr is large so that a wide band filter can be provided.

In addition, it is desirable to be able to select various piezoelectric materials used to form the piezoelectric substrate so as to increase design choices associated with forming a surface acoustic wave device.

SUMMARY OF THE INVENTION

To overcome the problems described above, preferred embodiments of the present invention provide a surface acoustic wave device which achieves a large impedance ratio, excellent resistance to external conditions, and increased freedom of choice of materials to be used to form the piezoelectric substrate incorporated therein.

According to preferred embodiments of the present invention, in a surface acoustic wave device generating BGS waves, a piezoelectric substrate includes a piezoelectric polycrystalline body and an interdigital transducer disposed on a surface of the piezoelectric substrate, wherein the surface acoustic wave device includes at least two layers disposed on the piezoelectric substrate, the at least two layers having different electrical characteristics and mechanical characteristics in a direction that is substantially perpendicular to the surface of the piezoelectric substrate on which the interdigital transducer is disposed, so that the degree of surface acoustic wave energy concentration in the surface is controlled.

As a result of this novel arrangement and construction, problems caused by the degree of wave concentration in the surface of the substrate are solved.

For example, one problem that is solved by preferred embodiments of the present invention occurs when a piezoelectric substrate having a small electromechanical coupling factor "k" is used. In such a case, the degree of surface acoustic wave energy concentration in the surface is reduced to decrease an impedance ratio. Another problem that is solved occurs when a piezoelectric substratewith a large electromechanical coupling factor "k" is used, the moisture resistance ability is deteriorated by excess surface acoustic wave energy concentration in the substrate surface.

Furthermore, in accordance with preferred embodiments of the present invention, a desired surface acoustic wave device can be comparatively easily formed at low cost by forming the above-described multi-layer structure or gradient structure using the piezoelectric substrate, which is preferably formed of ceramics.

For the purpose of illustrating the present invention, there is shown in the drawings several forms and embodiments which are presently preferred, it being understood, however, that the invention is not limited to the precise arrangements and instrumentalities shown.

DETAILED DESCRIPTION OF PREFERRED EMBODIMENTS

Figure 1:
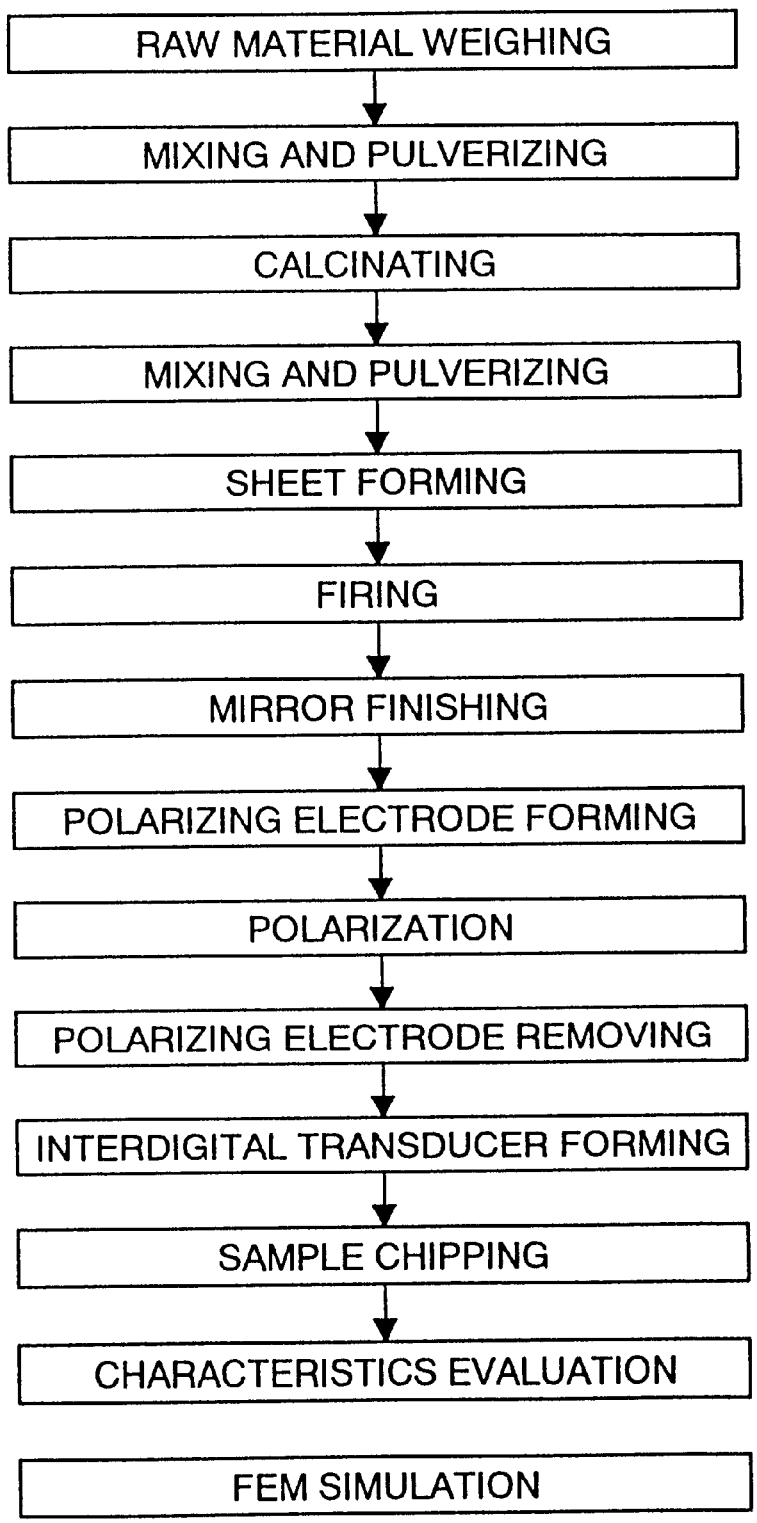
FIG. 1 is a drawing showing a process for manufacturing and evaluating of samples of an example according to a preferred embodiment of the present invention.

The inventors of the present invention studied the above-explained problems associated with the conventional surface acoustic wave devices using BGS waves. The inventors discovered that a degree of wave energy concentration in the surface contributes to the above-described problems. The BGS wave is known to have less wave energy concentration in the surface of the substrate compared to that of the Rayleigh wave. The degree of the BGS wave energy concentration in the substrate surface is approximately determined by the electromechanical factor "k" and the dielectric constant "ε" of the piezoelectric substrate. When electrodes are disposed on the surface of the piezoelectric substrate, the electromechanical factor "k" is predominant, so that it has been apparent that the degree of the BGS wave energy concentration in the surface increases according to increases in the electromechanical factor "k".

Therefore, when a piezoelectric substrate having a small electromechanical factor "k" is used, the degree of the BGS wave energy concentration in the substrate surface decreases so that the wave energy is distributed in the thickness direction of the piezoelectric substrate within a certain range. The decrease in the degree of concentration in the surface is a factor causing wave loss in the piezoelectric substrate. Therefore, this wave loss is considered to be a principal source of the above-mentioned decrease in the impedance ratio.

In view of this problem, even when a piezoelectric substrate with a small electromechanical factor "k" concentrates the BGS wave energy in the vicinity of the surface thereof, the decrease of the impedance ratio can be prevented. The inventors of the present invention have discovered that a surface acoustic wave element with a comparatively large impedance ratio can be formed even from a surface acoustic wave element having a small electromechanical factor "k" by concentrating the BGS wave energy in the vicinity of the substrate surface by reducing the electromechanical factor "k" only in the vicinity of the surface and arranging piezoelectric media to have larger electromechanical factors "k" in the thickness direction thereof, arranging piezoelectric media with different electromechanical factors "k" in a multi-layer structure or in a gradient structure, in the thickness direction of the piezoelectric substrate.

On the other hand, when a piezoelectric substrate with a large electromechanical factor "k" is used, there is a problem that environmental resistance, especially moisture resistance, is deteriorated so that changes in frequencies by a wet-proof test are increased. This problem results from the fact that the piezoelectric substrate with a large electromechanical factor "k" has a large degree of the BGS wave energy concentration in the substrate surface as described above, so that the surface acoustic wave propagates only in the vicinity of the substrate surface that is most responsive to deterioration caused by humidity and atmospheric temperature. Therefore, in contrast with the above-mentioned case, a surface acoustic wave element with a large electromechanical factor "k" having excellent moisture resistance can be provided by arranging piezoelectric media which have a large electromechanical factor "k" only in the vicinity of the substrate surface and arranging piezoelectric media having smaller electromechanical factors "k" at a portion that is spaced in the thickness direction from the surface so that the excess BGS wave energy concentration in the surface is minimized.

In these structures, it is preferable that the electromechanical coupling factor k changes in a stepwise manner or gradually and continuously in the thickness direction of the piezoelectric substrate. This is because an abrupt change in the electromechanical coupling factor k causes reflection or attenuation of BGS waves to result in adverse effects on propagation of the BGS waves.

To this end, the inventors have discovered that the piezoelectric substrate prepared by stacking a plurality of piezoelectric ceramic sheets having a different composition and firing the stack of the sheets can be suitably used. When a pair of piezoelectric ceramic sheets having a different composition are stacked and fired, an intermediate layer is formed at the boundary between the pair of piezoelectric ceramic sheets due to thermal diffusion. The intermediate layer has an intermediate composition and physical properties which fall between those of the pair of the piezoelectric ceramic sheets. Therefore, it is possible to make the change in the electromechanical coupling factor at the boundary between the pair of piezoelectric ceramic sheets in a stepwise manner. It is also possible that the composition may be changed gradually in the thickness direction within the intermediate layer. This further ensures the smooth or continuous changes of the electromechanical coupling factor. From this point of the view, the piezoelectric substrate used in the surface acoustic wave device of preferred embodiments of the present invention preferably includes at least three piezoelectric ceramic layers including an intermediate layer.

The discovery that characteristics can be greatly improved by controlling the degree of a surface acoustic wave energy concentration in the substrate surface is quite new and novel. Although a structure in which a plurality of piezoelectric single crystal plates are bonded to form a composite substrate is known and was disclosed, for example, in Japanese Unexamined Patent Publication No. 9-208399, such conventional techniques are directed to improving characteristics of a surface acoustic wave apparatus by maintaining good crystallization and bonding ability. These conventional techniques do not suggest controlling the degree of a surface acoustic wave energy concentration. In addition, because it is required in the conventional techniques that each layer constituting a composite substrate has high crystallinity, the change of the physical properties at each boundary is necessarily abrupt. These conventional features are quite different from those of preferred embodiments of the present invention.

The preferred embodiments of the present invention are directed to the control of the degree of surface acoustic wave concentration in the substrate surface and achieving improved characteristics thereby, which are the principal effects of preferred embodiments of the present invention.

These advantageous effects are achieved by forming a piezoelectric polycrystalline material to have a multi-layer structure or a gradient structure using a piezoelectric polycrystalline material with increased flexibility of the kind of materials to be arranged in a multi-layer structure or in a gradient structure and with excellent workability also.

Thus, according to preferred embodiments of the present invention, a surface acoustic wave device for generating a surface acoustic wave in response to an electrical signal being supplied to a transducer with intersecting interdigital electrodes disposed on a surface of a piezoelectric substrate includes a piezoelectric polycrystalline body defining the piezoelectric substrate, wherein the piezoelectric polycrystalline body includes at least two layers having different electrical characteristics and mechanical characteristics in a substantially perpendicular direction relative to the surface on which the intersecting interdigital electrodes transducers are disposed.

In a surface acoustic wave element according to preferred embodiments of the present invention, the piezoelectric substrate may be formed by depositing material so as to be gradient in electrical characteristics and mechanical characteristics.

In a surface acoustic wave element according to preferred embodiments of the present invention, the BGS wave may be used as the surface acoustic wave.

In a surface acoustic wave element according to preferred embodiments of the present invention, the piezoelectric substrate may be formed by sintering a laminated body which is preferably defined by laminating at least two sheets of piezoelectric ceramic materials having a different composition for each sheet.

In a surface acoustic wave element according to preferred embodiments of the present invention, a portion of the sheet may be thermo-diffused to an adjacent sheet to thereby form the piezoelectric substrate so as to be gradient in electrical characteristics and mechanical characteristics.

Hereinafter, preferred embodiments of the present invention are explained in more detail with reference to the drawings.

The preparation and evaluation processes of samples in examples of preferred embodiments of the present invention are illustrated in FIG. 1. The details thereof will be described below.

As raw materials, $Pb_3O_4$, $ZrO_2$, $TiO_2$, $MnCO_3$, $NiO$, and $Nb_2O_5$ were respectively weighed so as to obtain piezoelectric ceramic compositions "A", "B", and "C" defined by composition formulas in TABLE 1, and each mixture was mixed and pulverized by a ball mill for 4 to 32 hours.

TABLE 1

| Name of Composite | Composition Formula |
|---|---|
| Piezoelectric ceramic composition "A" | $Pb_{1.0}(Mn_{1/2}Nb_{2/3})_{0.06}Zr_{0.43}Ti_{0.51}O_3$ |
| Piezoelectric ceramic composition "B" | $PB_{1.0}(Mn_{1/3}Nb_{2/3})_{0.10}Zr_{0.41}Ti_{0.49}O_3$ |
| Piezoelectric ceramic composition "C" | $Pb_{1.0}(Ni_{1/4}Mn_{1/4}Nb_{2/3})_{0.10}Zr_{0.43}Ti_{0.47}O_3$ |

Then, after each mixture was dehydrated, dried, and calcined for 2 hours at a temperature of about 800° C. to 900° C., slurry was prepared by pulverizing the obtained powder for about 8 to 16 hours after mixing or adding about 3 to 10 weight % of binder, dispersing, and deforming agent thereto, and ceramic sheets with about 50 μm to 150 μm thickness were formed or manufactured using a doctor blade method.

Sheets "A", "B", and "C" formed of piezoelectric ceramic compositions "A", "B", and "C", respectively, were crimped according to each of the conditions indicated in FIGS. 2A to 2F so that each of the obtained units was fired for about 1 hour to about 3 hours at a temperature of about 1100° C. to about 1250° C. The one principal surface of the obtained baked sheet was mirror finished by the grindings of #800 to #8000 in order to form a piezoelectric substrate having a first surface layer of about 10 μm to about 100 μm thickness and the total element thickness of about 300 μm to about 700 μm.

Comb-shaped polarizing electrodes were formed on both principal surfaces of each piezoelectric substrate by Ag vapor deposition electrodes, and a polarization treatment was performed on the piezoelectric substrate so that the polarization direction was parallel to the surface direction of the piezoelectric substrate. The polarization was performed by applying an electric field of about 2.0 kV/mm to 4.0 kV/mm for about 30 to about 60 minutes in oil at a temperature of about 60° C. to about 120° C. Afterward, the Ag vapor deposition electrodes were removed by etching liquid to obtain a polarized piezoelectric substrate.

Figure 2A:
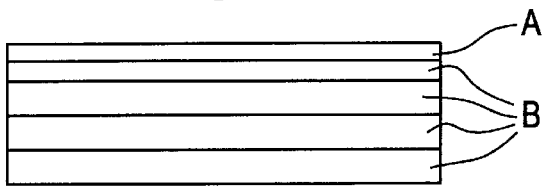
FIGS. 2A to 2F are schematic cross-sectional views of the piezoelectric substrates showing structures of piezoelectric substrates of samples according to preferred embodiments of the present invention.
Figure 2B:
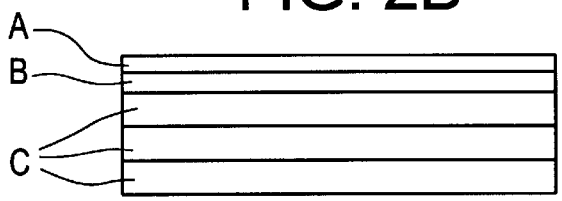
Figure 2C:
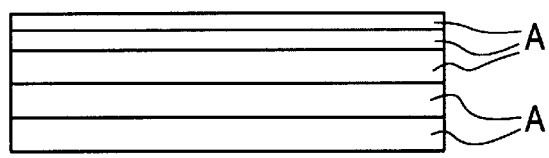
Figure 2D:
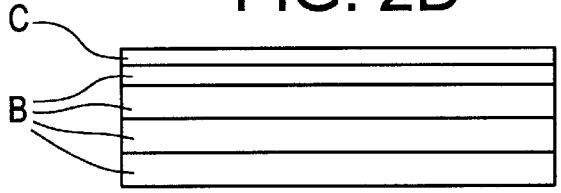
Figure 2E:
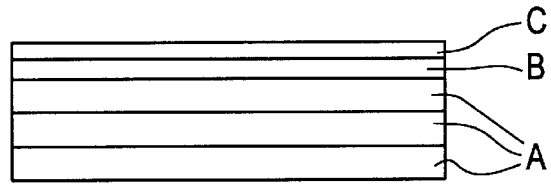
Figure 3A:
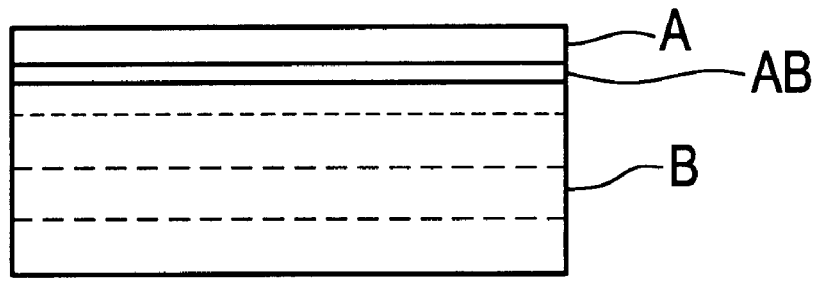
FIG. 3A is a schematic cross-sectional view illustrating a structure of a piezoelectric substrate defined by stacking layers as shown in FIG. 2A.
Figure 3B:
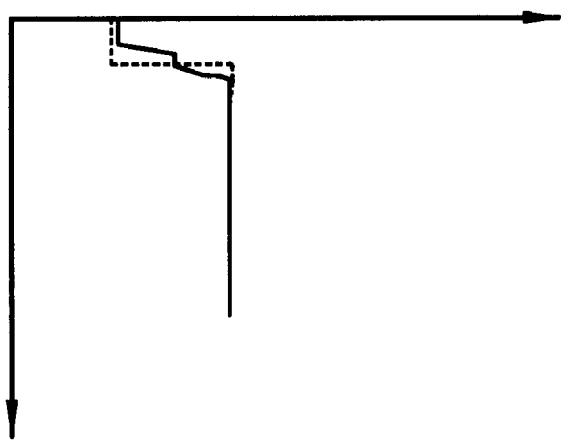
FIG. 3B shows a depth profile of an electromechanical coupling factor k in the substrate shown in FIG. 3A.
Figure 4A:
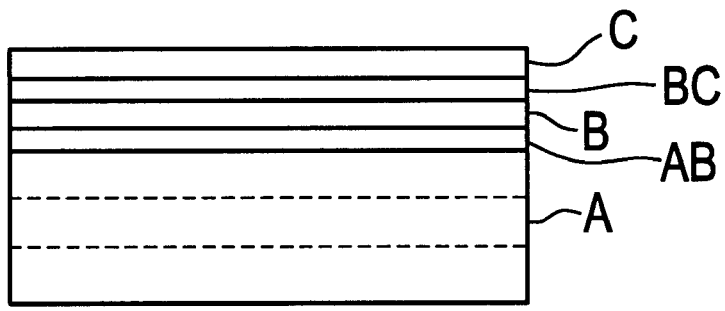
FIG. 4A is a schematic cross-sectional view illustrating a structure of a piezoelectric substrate defined by stacking layers as shown in FIG. 2E.
Figure 4B:
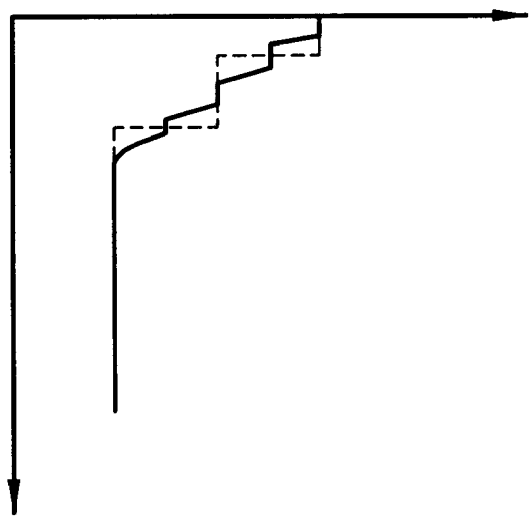
FIG. 4B shows a depth profile of an electromechanical coupling factor k in the substrate shown in FIG. 4A.

FIGS. 3A and 4A schematically show a structure of a piezoelectric substrate defined by stacking layers as shown in FIGS. 2A and 2E and firing the stacked layers. As shown in these figures, an intermediate layer AB and an intermediate layer BC are formed between the piezoelectric ceramic layers A and B and between the piezoelectric ceramic layers B and C, respectively. FIGS. 3B and 4B schematically show a depth profile of an electromechanical coupling factor k in these substrates. As is apparent from these figures, the formation of the intermediate layers AB and/or BC makes the change of the electromechanical coupling factor k in a stepwise manner. Also, the change of the electromechanical coupling factor k is made to be gradual within the intermediate layer AB or BC from the approximate center thereof toward the side facing the piezoelectric ceramic layers A, B or C. The thickness of the intermediate layer may be changed by adjusting the firing condition. As a result of this feature, the electromechanical coupling factor k can be changed in a multi-stepwise manner, thereby smoothing the change in the thickness direction.

Figure 5:
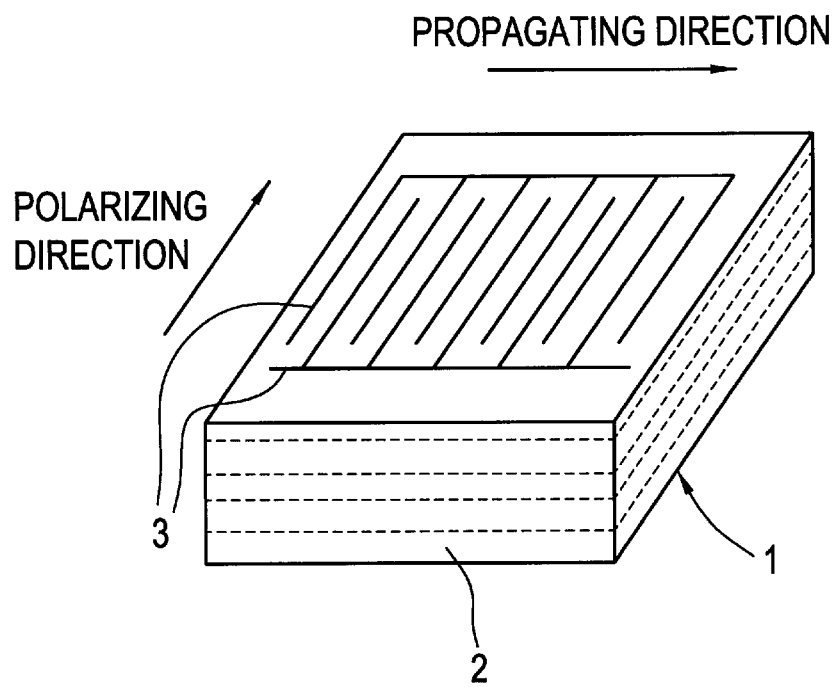
FIG. 5 is a perspective view showing an example of a preferred embodiment of the present invention.

Then, through conventional processes, an Al electrode film was formed on the one principal surface of the above-mentioned piezoelectric substrate 2 via a sputtering vapor deposition method, and thereafter, an interdigital transducer 3 including a pair of comb-shaped electrodes was formed by patterning the Al film using a photo-lithographic technique. In this case, the interdigital transducer 3 was arranged and oriented in a substantially perpendicular direction relative to that of the above-mentioned comb polarizing electrodes. A surface acoustic wave device 1 (a sample) shown in FIG. 5 was prepared for each of piezoelectric substrates formed as shown in FIGS. 2A to 2F by cutting the piezoelectric substrate into a chip component.

Each surface acoustic wave device was fixed to a jig having terminals and was wired to the terminals so that characteristics thereof were evaluated by an impedance analyzer. Evaluated items were impedance ratios Za/Zr at an anti-resonant point and at a resonant point, an electromechanical coupling factor "$k_{BGS}$" of the BGS wave, an mechanical quality factor "$Qm_{BGS}$" thereof, and a shift fr/fr of a resonant frequency before and after leaving the sample in moisture. The results are summarized in TABLE 2.

TABLE 2

Figure 2F:
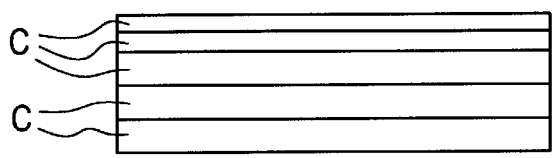

| Sample | Structure | $k_{BGS}$ (%) | Za/Zr (dB) | $Qm_{BGS}$ | fr/fr (%) |
|---|---|---|---|---|---|
| A-1 | FIG. 2A | 22.5 | 46 | 940 | 0.12 |
| A-2 | FIG. 2B | 22.0 | 45 | 910 | 0.12 |
| A-3* | FIG. 2C | 21.0 | 35 | 650 | 0.11 |
| C-1 | FIG. 2D | 47.0 | 50 | 870 | 0.25 |
| C-2 | FIG. 2E | 46.5 | 50 | 850 | 0.22 |
| C-3* | FIG. 2F | 48.5 | 53 | 870 | 0.52 |

In TABLE 2: Sample A-1 is a sample which includes the piezoelectric substrate having a multi-layer structure shown in FIG. 2A; Sample A-2 is a sample which includes the piezoelectric substrate having a structure shown in FIG. 2B, Sample A-3 is a sample including the piezoelectric substrate having a mono-layer structure shown in FIG. 2C; Sample C-1 is a sample including the piezoelectric substrate having a multi-layer structure shown in FIG. 2D; Sample C-2 is a sample including the piezoelectric substrate having a structure shown in FIG. 2E; Sample C-3 is a sample including the piezoelectric substrate having a mono-layer structure shown in FIG. 2F; and Samples A-3 and C-3 with added marks "*" are comparative examples which are outside of the scope of the present invention. In addition, this is the same in graphs shown in FIGS. 6 and 7.

In TABLE 2, fr/fr(%) indicates a rate of change of a resonant frequency fr in a wet-proof test after leaving the sample for 1000 hours in a constant temperature and humidity room of the ambient temperature of 60° C. and the humidity of 95% R.H.

Moreover, the energy distribution of the BGS wave in the vicinity of the surface for each of the samples of surface acoustic wave devices was obtained by simulation using a finite element method (FEM). The results are shown in FIGS. 6 and 7.

When Samples A-1, A-2, and A-3 in TABLE 2 are compared with one another, although the electromechanical coupling factors "$k_{BGS}$" of each sample is extremely small and roughly have a value of about 20%, in Samples A-1 and A-2 according to preferred embodiments of the present invention compared to Sample A-3 of the comparative example, impedance ratios Za/Zr are no less than about 45 dB so that it can be seen that the impedance ratio Za/Zr capable of forming an excellent filter is obtained in preferred embodiments of the present invention.

Figure 6:
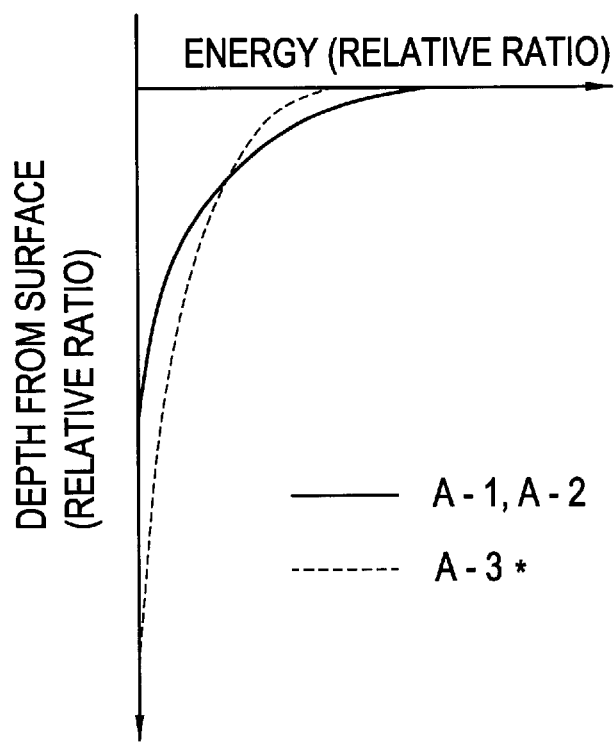
FIG. 6 is a graph showing the result of the BGS wave energy distribution in the vicinity of the surface of the substrate used in various samples of an example of preferred embodiments of the present invention obtained by simulation using a finite element method (FEM).
Figure 7:
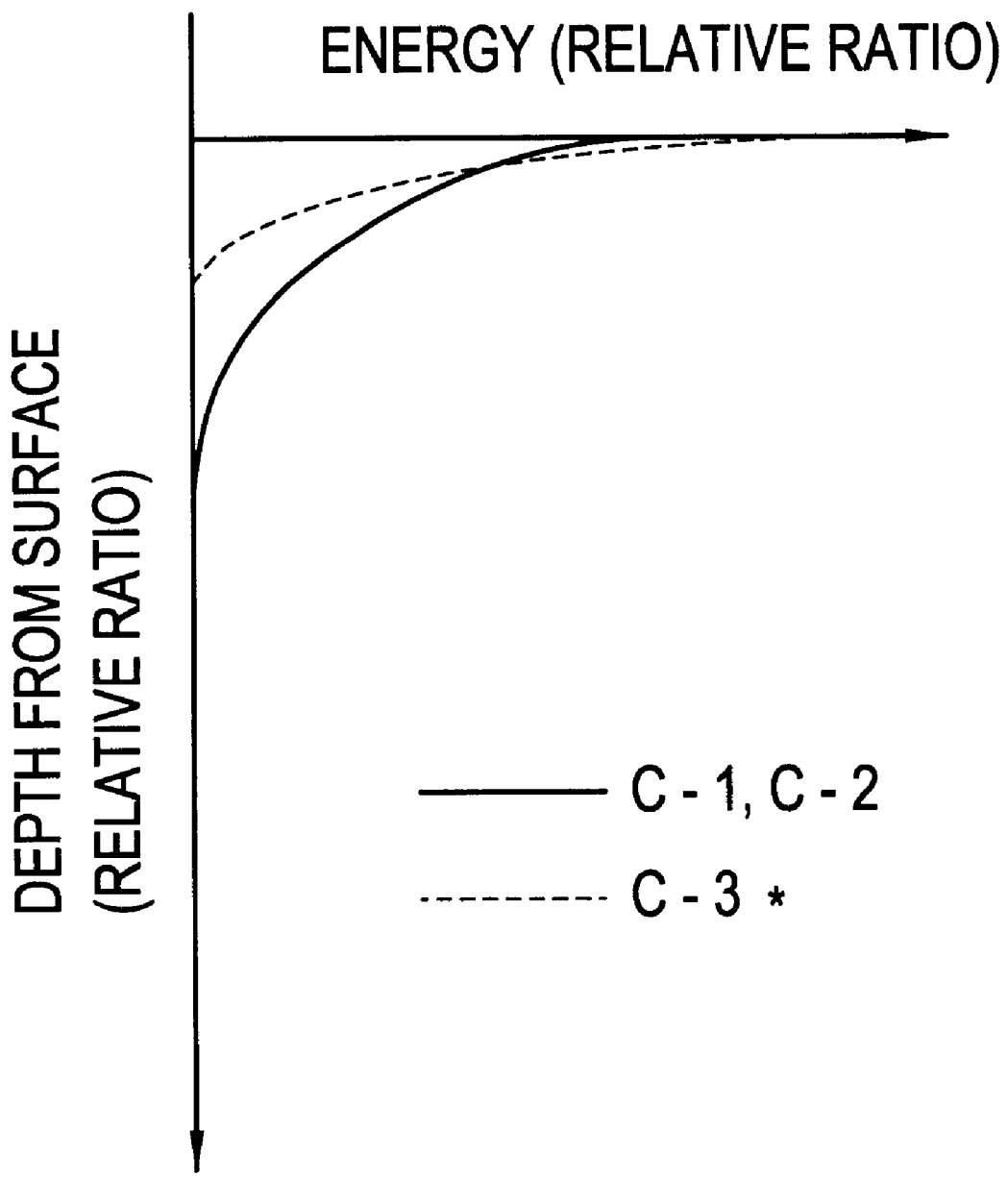
FIG. 7 is a graph showing the result of the BGS wave energy distribution in the vicinity of the surface of the substrate used in other samples of an example of preferred embodiments of the present invention obtained by simulation using a finite element method (FEM).

From the simulation result shown in FIG. 6, it can be seen that in Samples A-1 and A-2 according to preferred embodiments of the present invention, the energy of the BGS wave is concentrated in the vicinity of the substrate surface compared to Sample A-3 of the comparative example. In a surface acoustic wave device, this shows that the BGS wave energy can be concentrated in the vicinity of the surface by reducing the electromechanical coupling factor "k" only in the vicinity of the surface and arranging piezoelectric media having larger electromechanical coupling factors "k" in the thickness direction therefrom by arranging piezoelectric media with different electromechanical coupling factors "k" in a multi-layer structure or in a gradient structure in the thickness direction of the piezoelectric substrate. Accordingly, the wave loss in a piezoelectric substrate caused by the reduced degree of wave concentration in the surface can be prevented and minimized even in surface acoustic wave devices with small electromechanical coupling factors "k" thereby making possible the provision of a surface acoustic wave device having a very small reduction in the impedance ratio.

In the next example, when Samples C-1, C-2, and C-3 in TABLE 2 are compared with one another, although the electromechanical coupling factors "$k_{BGS}$" of every sample are extremely large and are not less than 45%, in Samples C-1 and C-2 according to preferred embodiments of the present invention of the comparative example, it can be seen that the shift of a resonant frequency after a wet-proof test for 1000 hours can be reduced to less than half compared to Sample C-3.

From the simulation result shown in FIG. 7, it can be seen that in Samples C-1 and C-2 according to preferred embodiments of the present invention, excess concentration of the energy of the BGS wave in the surface be restrained compared to Sample C-3 of the comparative example.

The problem that when a piezoelectric substrate with a large electromechanical coupling factor "k" is used, antiweather ability, especially moisture resistance ability, is deteriorated, so that changes in frequencies by a wet-proof test are increased results from the reason that the piezoelectric substrate with a large electromechanical coupling factor "k" has a large degree of the BGS wave energy concentration in the surface as described above, so that the wave propagates only in the vicinity of the surface that mostly responds to deterioration by the humidity and the atmospheric temperature. Therefore, as described above, a surface acoustic wave device with a large electromechanical coupling factor "k" having excellent moisture resistance ability can be formed by preventing excess BGS wave energy concentration in the substrate surface by arranging piezoelectric media having a large electromechanical coupling factor "k" only in the vicinity of the substrate surface and arranging piezoelectric media having smaller electromechanical coupling factors "k" in the thickness direction therefrom.

Although in the above example, the piezoelectric substrate preferably includes an intermediate layer formed by thermal diffusion, the piezoelectric substrate may have a structure in which at least three piezoelectric layers are stacked so that mechanical or electrical properties vary gradually or in a stepwise manner. That is, preferred embodiments of the present invention provide a technique for controlling the degree of surface acoustic wave energy concentration in the surface to improve characteristics of a surface acoustic wave device by forming a surface acoustic wave device including a piezoelectric substrate of a multi-layer structure or a gradient structure including piezoelectric media each being different in composition or in electrical and mechanical characteristics. Therefore, it is apparent that the same effect can be also obtained by changing the layer thickness and the number of layers even in a surface acoustic wave device of multi-layer structure almost without inter-diffusion between layers, in which inter-diffusion is restrained by low temperature sintering of a piezoelectric ceramic composition, for example, or in a surface acoustic wave device which is formed by a thin film forming method such as a CVD process.

Furthermore, the BGS wave is used in this example of the preferred embodiments of the present invention. Since in other surface acoustic waves such as the Rayleigh wave, the degree of wave concentration in the surface is affected by electrical or mechanical characteristics of the surface acoustic wave device, the same effect can be expected to be obtained in other surface acoustic waves.

In addition, surface acoustic wave devices having layered structures similar to the present invention are disclosed in Japanese Unexamined Patent Publication No. 9-312546, Japanese Unexamined Patent Publication No. 10-107581, Japanese Unexamined Patent Publication No. 10-135773, etc., other than Japanese Unexamined Patent Publication No. 9-208399. In Japanese Unexamined Patent Publication No. 9-208399, Japanese Unexamined Patent Publication No. 9-312546, and Japanese Unexamined Patent Publication No.10-107581, mono-crystal substrates are used and the objects of these inventions are the effects of improving crystallinity (lattice defect, crack) of mono-crystals. It is apparent that these configurations and effects are extremely different from those of preferred embodiments of the present invention.

In Japanese Unexamined Patent Publication No. 10-135773, the stress-migration tolerance of an interdigital electrode transducer is to be improved. The configuration includes non-piezoelectric mono-crystals being extremely different from the surface acoustic wave device according to preferred embodiments of the present invention. It is apparent that the effect thereof is also extremely different from controlling of the degree of surface acoustic wave concentration in the surface according to preferred embodiments of the present invention.

While preferred embodiments of the present invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave device comprising:
   a piezoelectric substrate; and
   an interdigital transducer provided on the piezoelectric substrate;
   wherein the piezoelectric substrate includes at least two piezoelectric ceramic layers made of a polycrystalline material and stacked so that electrical characteristics and mechanical characteristics thereof vary in a direction that is substantially perpendicular to a surface of the piezoelectric substrate.

2. A surface acoustic wave device according to claim 1, wherein the piezoelectric substrate includes a piezoelectric ceramic material which is arranged to have non-uniform electrical characteristics and mechanical characteristics.

3. A surface acoustic wave device according to claim 1, wherein the piezoelectric substrate and the interdigital transducer are arranged to generate BGS waves as surface acoustic waves.

4. A surface acoustic wave device according to claim 1, wherein the piezoelectric substrate includes a sintered laminated body formed by sintering at least two sheets which are made of piezoelectric ceramic materials having a different composition for each of the at least two sheets, and the at least two piezoelectric ceramic layers corresponds to the at least two sheets.

5. A surface acoustic wave device according to claim 4, wherein the piezoelectric substrate further includes another piezoelectric layer corresponding to an intermediate layer formed by the an inter-diffusion of the at least two sheets.

6. A surface acoustic wave device according to claim 1, wherein an electromechanical coupling factor k changes in a stepwise manner along a thickness direction of the piezoelectric substrate.

7. A surface acoustic wave device according to claim 1, wherein a electromechanical coupling factor k changes in a continuously gradual manner along a thickness direction of the piezoelectric substrate.

8. A surface acoustic wave device according to claim 1, wherein the at least two piezoelectric ceramic layers have different compositions from each other.

9. A surface acoustic wave device according to claim 1, wherein the piezoelectric substrate includes three piezoelectric ceramic layers and no intermediate layers therebetween.

10. A surface acoustic wave device according to claim 1, wherein the piezoelectric substrate includes three piezoelectric ceramic layers and two intermediate layers provide respective interfaces between the three piezoelectric ceramic layers.

11. A surface acoustic wave device according to claim 1, wherein the piezoelectric substrate and the interdigital transducer are arranged to generate BGS waves and such that the BGS wave energy is concentrated in the vicinity of the surface of the substrate on which the interdigital electrode is disposed.

* * * * *